United States Patent
Kubena et al.

(10) Patent No.: US 11,863,194 B1
(45) Date of Patent: *Jan. 2, 2024

(54) PHONONIC COMB ENHANCED ATOMIC CLOCK

(71) Applicant: HRL Laboratories, LLC, Malibu, CA (US)

(72) Inventors: Randall Kubena, Malibu, CA (US); Walter Wall, Malibu, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/567,034

(22) Filed: Dec. 31, 2021

Related U.S. Application Data

(60) Provisional application No. 63/144,614, filed on Feb. 2, 2021.

(51) Int. Cl.
  *H03L 7/26* (2006.01)
  *G04F 5/14* (2006.01)

(52) U.S. Cl.
  CPC . *H03L 7/26* (2013.01); *G04F 5/14* (2013.01)

(58) Field of Classification Search
  CPC ......................................................... H03L 7/26
  USPC ....................................................... 331/94.1
  See application file for complete search history.

(56) References Cited

U.S. PATENT DOCUMENTS

| | | | |
|---|---|---|---|
| 4,070,635 A | 1/1978 | Healey | |
| 4,132,964 A | 1/1979 | Wilcox | |
| 7,750,535 B2 | 7/2010 | Kubena | |
| 7,851,971 B2 | 12/2010 | Chang | |
| 8,601,607 B2 | 12/2013 | Hagmann | |
| 8,765,615 B1 | 7/2014 | Chang | |
| 8,994,465 B1 | 3/2015 | Kubena | |
| 10,110,198 B1 | 10/2018 | Kubena | |
| 10,389,392 B1 | 8/2019 | Kubena | |
| 10,819,276 B1 | 10/2020 | Kubena | |
| 11,156,897 B2 | 10/2021 | Kubena | |
| 11,239,823 B1 | 2/2022 | Kubena | |
| 11,275,099 B1 | 3/2022 | Sorenson | |

(Continued)

FOREIGN PATENT DOCUMENTS

| KR | 10-2008-0044977 | 5/2008 |
|---|---|---|
| KR | 10-2012-0132987 | 12/2012 |

(Continued)

OTHER PUBLICATIONS

U.S. Appl. No. 16/932,431, filed Jul. 17, 2020, Kubena.

(Continued)

*Primary Examiner* — Joseph Chang
(74) *Attorney, Agent, or Firm* — Ladas & Parry, LLP

(57) ABSTRACT

An atomic clock stabilized or disciplined by tooth selected from a phononic comb of frequency teeth. A method of stabilizing an atomic clock having a reference oscillator, the method comprising selecting a particular tooth from a phononic comb of frequency teeth and applying a correction signal to said reference oscillator, the correction signal being based the selected tooth of said phononic comb. The disclosed technology is not limited to stabilizing reference oscillators associated with atomic clocks and thus may be utilized to stabilize reference oscillators whether or not they are interfaces with an atomic clock.

31 Claims, 11 Drawing Sheets

(56) References Cited

U.S. PATENT DOCUMENTS

| | | | |
|---|---|---|---|
| 2010/0321117 | A1 | 12/2010 | Gan |
| 2012/0294319 | A1 | 11/2012 | Maleki |
| 2015/0326320 | A1* | 11/2015 | Fertig ............... H04J 14/02 |
| | | | 398/115 |
| 2017/0047893 | A1 | 2/2017 | Nguyen |
| 2018/0157148 | A1 | 6/2018 | Kim |
| 2019/0181611 | A1* | 6/2019 | Maleki ............ H01S 3/094076 |
| 2019/0250198 | A1 | 8/2019 | Kubena |
| 2020/0158769 | A1 | 5/2020 | Liu |
| 2021/0091748 | A1 | 3/2021 | Kubena |

FOREIGN PATENT DOCUMENTS

| | | |
|---|---|---|
| WO | 2014-018444 | 1/2014 |
| WO | 2019-217668 | 11/2019 |

OTHER PUBLICATIONS

U.S. Appl. No. 17/348,344, filed Jun. 15, 2021, Kubena.
U.S. Appl. No. 16/932,427, filed Jul. 17, 2020, Kubena.
U.S. Appl. No. 16/932,447, filed Jul. 17, 2020, Kubena.
U.S. Appl. No. 16/775,242, filed Jan. 28, 2020, Kubena.
From U.S. Appl. No. 17/348,344 (unpublished, non-publication requested), Office Action dated Jan. 27, 2022.
From U.S. Appl. No. 16/932,455 (now published as U.S. Pat. No. 11,156,897), Notice of Allowance dated Jun. 23, 2021.
From U.S. Appl. No. 16/932,455 (now published as U.S. Pat. No. 11,156,897), Office Action dated Apr. 22, 2021.
PCT International Search Report and Written Opinion from PCT/US2020/051863 dated Jan. 4, 2021.
Askari, S. et al., "Near-Navigation Grade Quad Mass Gyroscope With Q-Factor Limited by Thermo-Elastic Damping," Solid-State, Actuators, and Microsystems Workshop Technical Digest, Hilton Head, South Carolina, USA, 2016, pp. 254-257.
Bennett, S. P. et. al., "Magnetic Field Response of Doubly Clamped Magnetoelectric Microelectromechanical AlN—FeCo Resonators," Applied Physics Letters 111, 252903 (2017).
Bhatia, A. et al., "Linearization of Phase-Modulated Analog Optical Links using a Four-Wave Mixing Comb Source," Optics Express, DOI: 10.1364/OE 22.030899, Dec. 4, 2014.
Chang, et al., "Nonlinear UHF Quartz MEMS Oscillator with Phase Noise Reduction," 26th IEEE International Conference on MicroElectroMechanical Systems, Taipei, Taiwan, Jan. 20-24, 2013, pp. 781-784.
Ganesan, A., et al., "Evidence for Simultaneous Growth and Saturation Mechanisms in Phononic Frequency Combs," IEEE, 2019 Frequency Control Symposium, Orlando, Fl. Apr. 14-18, 2019 (3 pages).
Ganesan, A., et al., "Phononic Frequency Combs for Engineering MEMS/NEMS Devices with Tunable Sensitivity," 2019 IEEE (4 pages).
Ganesan, A. et al., "Phononic Frequency Comb via Intrinsic Three-Way Mixing," Physical Review Letters, PRL 118, 033903 (2017), (5 pages).
Haiti, et al., "Reducing oscillator PM noise from AM-PM noise correlation," Electronics letters 50.17 (2014): 1195-1197.
Howe, et al., "PM-AM correlation measurements and analysis,". May 2012, IEEE International Frequency Control Symposium Proceedings (pp. 1-5). IEEE.
Hui, Y. et al., High Resolution Magnetometer Based on a High Frequency Magnetoelectric MEMS-CMOS Oscillator, Journal of Micromechanical Systems, vol. 24, No. 1, Feb. 2015, pp. 134-143.
Kominis, et al., "A subfemtotesla multichannel atomic magnetometer," Nature, vol. 422, pp. 596-599 (2003).
Krishnamoorthy, U., et al., "In-plane MEMS-based Nano-g Accelerometer with Sub-wavelength Optical Resonant Sensor," Sensors and Actuators A: Physical, 145-146, Jul.-Aug. 2008, pp. 283-290.
Kubena, et al., "A Fully Integrated Quartz MEMS VHF TCXO," 2017 IEEE Frequency Control Symposium, Besancon, Fr., pp. 68-71, Jul. 2017.
Kubena, R. L., et al. "Phononic Comb Generation in High-Q Quartz Resonators", Applied Physics Letters, 116, 053501 (2020).
Nan, et.al., "Acoustically Actuated Ultra-Compact NEMS Magnetoelectric Antenna," Nature Communications, 8:296, DOI: 10.1038/s41467-017-00343-8 (2017), pp. 1-8.
Quitin, François, et al., "Distributed receive beamforming: A scalable architecture and its proof of concept." 2013 IEEE 77th Vehicular Technology Conference (VTC Spring) (5 pages).
Sheng, et al., "A Microfabricated Optically-Pumped Magnetic Gradiometer," Applied Physics Letters 110, 031106 (2017).
Veryaskin, A. "Gravity, Magnetic and Electromagnetic Gradiometry: Strategic Technologies in the 21st century", IOP ebooks, 2018 (57 pages).
Vrba, J., "Squid Sensors: Fundamentals, Fabrication and Applications," edited by H. Weinstock, Kluwer Academic, Dordrecht, The Netherlands, 1996, p. 117.
Wall, Walter S., et al., "Phase Noise Transfer in High-Q Quartz Phononic Frequency Combs," IEEE, 2020 (4 pages).
Wang, S. et al., "A MEMS Resonant Accelerometer for Low-Frequency Vibration Detection," Sensors and Actuators A: Physical, 283, Nov. 2018, pp. 151-158.
WenJie, W. et al., "A Nano-g MEMS Accelerometer for Earthquake Monitoring," 19th Intern. Conf. on Solid-State Sensors, Actuators and Microsystems (Transducers), DOI 10.1109/Transducers 2017, pp. 599-602.
Yao, et. al., "Bulk Acoustic Wave-Mediated Multiferroic Antennas: Architecture and Performance Bound," IEEE Transactions on Antennas and Propagation, vol. 63, No. 8, Aug. 2015.
Zhai, J.., et. al., "Detection of Pico-Tesla Magnetic Fields using Magneto-Electric Sensors at Room Temperature," Applied Physics Letters, 88, 062510 (2006).
"Phase Detector/Frequency Synthesizer: ADF4002 Data Sheet" Analog Devices 2006-2015, http://www.analog.com, pp. 1-20.

* cited by examiner

PHONONIC COMB ENHANCED ATOMIC CLOCK

CROSS REFERENCE TO RELATED APPLICATIONS

This application claims the benefit of US Provisional Patent Application Ser. No. 63/144,614 filed 2 Feb. 2021 which is also entitled "Phononic Comb Enhanced Atomic Clock". The disclosure of that US Provisional Patent Application is hereby incorporated herein by reference.

This application is related to U.S. Provisional Patent Application Ser. No. 63/083,619 filed 25 Sep. 2020 and entitled "Noise Suppression in a Phononic Comb" and to its related non-provisional patent application Ser. No. 17/348,344 filed 15 Jun. 2021, the disclosures of which are hereby incorporated herein by reference.

This application is also related to the technology disclosed in U.S. Provisional Patent Application Ser. No. 62/904,052, filed 23 Sep. 2019, and entitled "Enhanced Stability Oscillators using a Phononic Comb", and to its related non-provisional patent application Ser. No. 16/932,455, filed 17 Jul. 2020, and having the same title as its related provisional application, the disclosures of which are hereby incorporated herein by reference.

This application is also related to the technology disclosed in US Provisional Patent Application Ser. No. 62/881,069, filed 31 Jul. 2019 and entitled "Phononic Comb Enhanced Gradiometers" and its corresponding non-Provisional US Patent Application Ser. No. 16/932,431, filed 17 Jul. 2020, and having the same title as its related provisional application, the disclosures of which are hereby incorporated herein by reference.

STATEMENT REGARDING FEDERALLY SPONSORED RESEARCH OR DEVELOPMENT

None.

TECHNICAL FIELD

This technology relates to Atomic Clocks and Phononic Combs

BACKGROUND

Fluctuations or noise in precision clocks fundamentally limits the degree to which sensors and communication nodes can be synchronized. For communication networks, this limitation translates into reductions in achievable resolution and sensitivity, as well as increased bit error rate for communication links. Although atomic clocks afford excellent frequency stability at very long time scales (minutes to years), their short and intermediate stability (<1 sec.) are largely determined by the stability of conventional reference oscillators integrated into or with the clock.

Long term stability is related to low frequency phase noise and similarly short-term stability is related to high frequency phase noise. In regards to this disclosure "high frequency" phase noise is considered to be >10 Hz whereas "low frequency" phase noise is considered be <10 Hz. Using these definitions, "long term stability" may be defined as fluctuations occurring over a time scale>100 ms and "short term stability" may be defined as fluctuations occurring over a time scale<100 ms.

Conventional reference oscillators integrated into or with atomic clocks are typically embodied as oven-controlled crystal oscillators (OCXOs). Despite more than 60 years of research into compact and stable oscillators, these devices are still fundamentally limited by the achievable quality factor of the resonators (typically a quartz stress-compensated (SC-cut) crystal resonator), as well as noise in the sustaining circuits coupled to the resonator. This disclosure describes a technique for locking the reference oscillator for an atomic clock to a high stability tooth of a phononic frequency comb. Several embodiments are described for locking a reference oscillator to the atomic transitions for long-term stability while reducing the phase noise by 20-40 dB over offset frequencies of 10 Hz to 1 MHz by locking the reference oscillator to a tooth of a phononic comb.

Next generation atomic clocks are moving to higher frequency RF signals due to the use of higher frequency optical transitions for better stability. Current Rb or Cs atomic clocks operate at 6.84 and 9.19 GHz respectively while next generation Hg atomic clocks operate at 40.56. When referencing to the higher transition frequencies of next generation atomic clocks, the phase noise will be increase with the conventional OCXOs used with them. Thus, a lower phase noise reference oscillator (compared to a conventional OCXO) is desirable to reduce short-term noise and lower the otherwise needed integration time to reach a desired long-term stability for current generation atomic clocks but even more importantly for next generation atomic clocks.

Precision clocks, atomic or otherwise, are useful in radar, navigation, and communication network applications. All these technologies rely on accurate and precision timing for State of the Art (SoA) operation. Many of these systems utilize, or would like to utilize, small, low compact Size, Weight and Power (c SWAP) OCXOs and atomic clocks for timing synchronization. Examples of the impact of clock phase noise and timing jitter are given below.

I. Enhanced Beamforming-Beamforming allows multiple RF nodes to be combined in a direct and dynamic way to focus attention on areas and signals of interest, improving signal-to-noise ratio and reducing unwanted interference. This process is particularly important for applications in signal collection and radar. Effective beamforming requires accurate phasing of multiple sensor nodes, which relies in large part on the ability to synchronize the timing and phase of the nodes. See, for example, Quitin, Francois, Andrew Irish, and Upamanvu Madhow, "Distributed receive beamforming: A scalable architecture and its proof of concept." 2013 *IEEE 77th Vehicular Technology Conference (VTC Spring)*. IEEE, 2013, the disclosure of which is hereby incorporated herein by reference. This challenge becomes more pronounced at higher frequencies (e.g., mmWave bands) as shorter wavelengths require more stringent timing/phase control and upconverted (multiplied by M) reference oscillators typically suffer from a 20 log(M) dB increase in phase noise.

II. Improved Communication Data Rate-Communication networks rely on accurate timing and phase synchronization to ensure successful transmission and reception of data. Errors in timing and/or frequency can lead to misinterpreted bits and significantly increase bit error rate (BER). This problem is more pronounced for networks employing higher order modulation schemes as larger signal-to-noise ratios are generally required for low BER operation. For multi-carrier systems, high-frequency offset phase noise (corresponding to short-term stability) can further increase BER by creating interference between neighboring carriers and consequently limiting the number of carriers that can be packed into a given bandwidth.

III. Improved Clutter Suppression in Radar-Doppler filtering is a common technique for separating target returns from background clutter based on the velocities of scatterers relative to the radar. In many cases, returns from clutter can be substantially larger than those from targets, and if the clock used by the radar contains substantial phase noise, target returns can be masked by high-frequency offset phase noise on clutter returns. By reducing such noise, improved sub-clutter visibility of radar targets can be achieved.

The best performance low c-SWaP clocks are either TCXOs or OCXOs, while atomic clock-based systems are large, expensive and power hungry. TCXOs are the least expensive (several $) and require the lowest power (~10 mW), while miniaturized commercial OCXOs typically require hundreds of mWs of power and can cost around $1-2k. Although the long-term stability (msecs. to days) of atomic clocks can be many orders of magnitude better than a TCXO or OCXO, their short-term stabilities are all very similar. This is because an atomic physics package is only used to servo out the long-term drifts (>100 msec) associated with mechanical clocks. Due to the statistical nature of the atomic transitions, the atomic package can be noisy over short time periods. The typical short-term fractional frequency deviations (ADEV) of most all small portable clocks is around $10^{-11}$ @ 1 sec. (determined by the reference oscillator). However, both long- and short-term stability are needed for many applications such as radar and timing synchronization. Commercial atomic clock packages having imbedded atomic clocks are available from Microchip Technology, Inc. of Chandler, AZ.

By locking the mechanical clock within a PLL to a highly stable tooth of a phononic frequency comb as described in the patent documents referenced above, it is anticipated that the phase noise of the atomic clock can be improved by 20-40 dB within the frequency offset range of 10 Hz to 1 MHz. This can be achieved with simple, small, and low-cost components for low c-SWaP applications. Although other oscillators types such as SAW and dielectric cavity oscillators are sometimes used for low phase noise at high offset frequencies (>10 kHz), their phase noise below 1 kHz is many tens of dB higher than crystal OCXOs. Thus, a phononic comb enhanced OCXO would be highly desirable for the reference for an atomic clock.

Phononic combs in quartz resonators possess unique properties. These properties make a reduction of the phase noise of oscillators by 20-40 dB in a wide frequency range a possibility. This frequency range is dictated by the spacings between the teeth of the comb.

BRIEF DESCRIPTION OF THE INVENTION

The basis of the approach disclosed herein to reduce the noise of a reference oscillator rests on the principle that much of this noise is due to electronic noise (recombination, thermal, shot) in the sustaining circuits driving a mechanical resonator and is only filtered by the Q of the resonator at close-to-carrier frequencies. If this noise can be additionally filtered over a wider bandwidth by the passive mechanical element producing the phononic comb, then the resulting low noise comb tooth can be used as a reference for the atomic clock.

In one aspect the present invention provides an clock having a reference oscillator in which stability of the reference oscillator is improved by a stability of a selected tooth of a comb of frequencies. The clock may be an atomic clock.

The tooth that is selected is a tooth evidencing the best stability among the teeth generated by a nonlinear element having a suitable amplitude for controlling the reference oscillator.

The selected tooth is preferably selected by circuitry comprising either a resonator coupled in a Phase Locked Loop configuration with the nonlinear element or circuit including a high bandpass filter coupled to the nonlinear element.

In another aspect the present invention provides a method of stabilizing a reference oscillator, the method comprising selecting a particular tooth from a phononic comb of frequency teeth generated by a non-linear element and applying a correction signal to said reference oscillator, the correction signal being based the selected particular tooth of said phononic comb. The reference oscillator may be a reference oscillator of an atomic clock.

The selected tooth of the phononic comb is selected due to its superior stability compared to other amplitude-suitable teeth in said comb, the superior stability being evidenced by the fact that the teeth when their amplitudes are plotted versus changes in the frequency of a drive signal utilized to generate the phononic comb, the selected tooth has a slope on the plot that is greater than all or at least most of the other teeth that are also plotted.

BRIEF DESCRIPTION OF THE DRAWINGS

FIG. 3*a* is a schematic diagram of the circuitry with the three resonators of second embodiment of FIG. 3, showing one implementation thereof, while

FIG. 4a is a schematic diagram of the circuitry with the three resonators of third embodiment of FIG. 4, showing one implementation thereof, while

DETAILED DESCRIPTION

Figure 1:
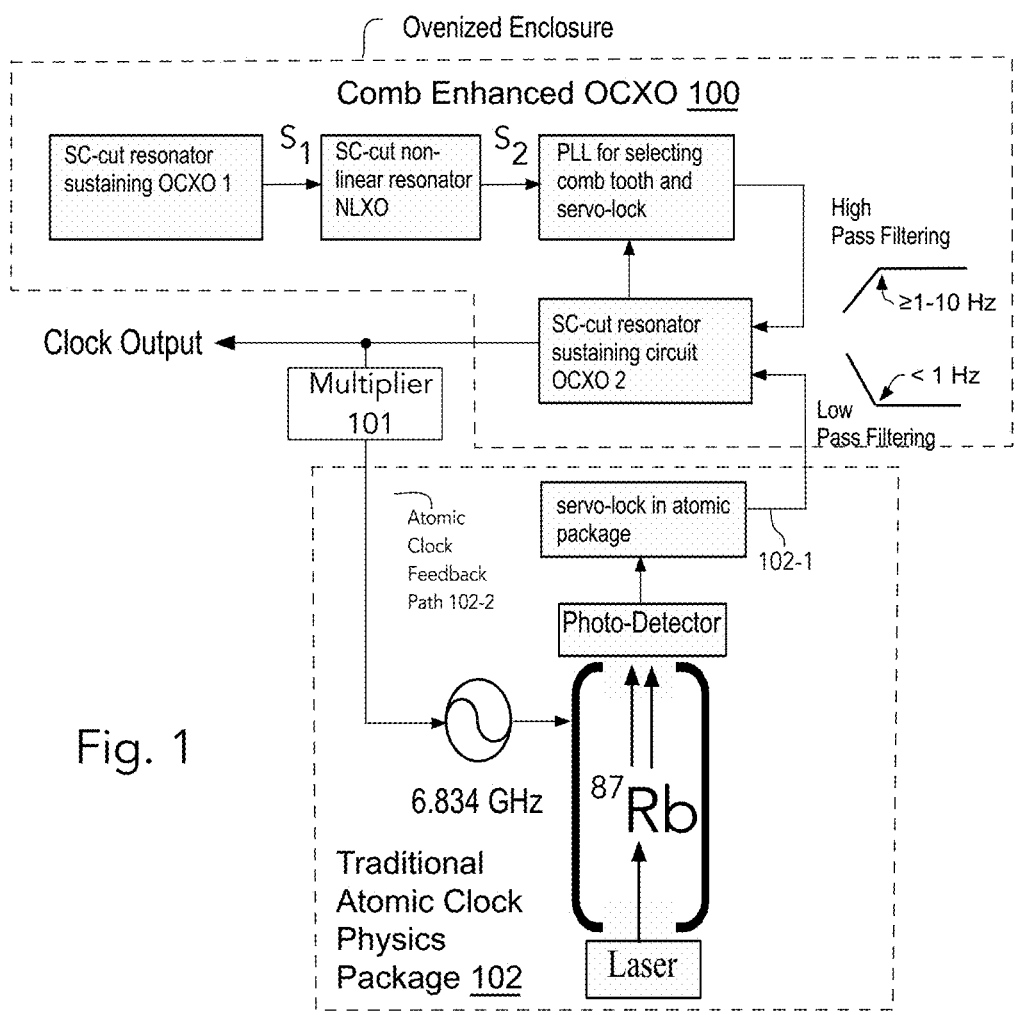
FIG. 1 is a schematic diagram of a first embodiment of a phononic comb-enhanced atomic clock using the stability of a selected tooth of the teeth of the comb generated by a non-linear resonator to reduce the phase noise of the atomic clock from 10 Hz to 1 MHz offset frequencies (at nΔ in FIG. 1 where Δ is the offset frequency) by 20-40 dB.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

The technology disclosed herein is related to that disclosed in the patent applications referenced above and extends and adapts the phononic combs described therein for application to atomic clocks 102. In this case, the reference RF oscillator for a prior art atomic package, which is usually embodied as an Oven Controlled Crystal (Xtal) Oscillator (OCXO,) is replaced with the comb-enhanced OCXO 100, shown in FIG. 1 for example. The comb-enhanced OCXO 100 is coupled with a conventional atomic clock 102 for improving the clock signal generated thereby.

For the comb enhanced OCXO 100, SC-cut based oscillator circuits OXCO 1 and OXCO 2 are preferably used for (i) producing the driving signal $S_1$ (by OXCO 1; also see the SC-cut quartz resonator 30 of FIG. 1b in the OXCO 1 sustaining circuit) and for locking to a particular comb tooth (by OXCO 2; also see the SC-cut quartz resonator 60 on FIG. 1b in the OXCO 2 sustaining circuit) of the frequency comb $S_2$ (see also FIG. 1a) produced by the driving signal $S_1$ in a nonlinear resonator element (see resonator 40 on FIG. 1b, for example) in a NLXO circuit. Using SC-cut quartz resonators for elements 30, 40 and 60 in the OXCO 1, OXCO 2 and NLXO circuits is preferred due to their lower frequency sensitivity to temperature especially when ovenized. The entire comb-enhanced OCXO 100 is preferably ovenized to reduce temperature related drifts as opposed to ovenizing the individual resonators 30, 40 and 60 so that all three resonators are exposed to a common temperature environment.

The loop bandwidth (BW) of the comb-enhanced OCXO 100 is set with a high pass frequency filter (see filter 70 on FIG. 1b) with a corner frequency 1-10 Hz. Thus, only phase noise above about 10 Hz offset frequencies is disciplined (stabilized) by the stability of the selected tooth of the comb. Based on initial measurements of the phase noise reductions provided by phononic comb teeth in quartz nonlinear resonators, the comb-enhanced atomic clock will demonstrate a reduction in phase noise from 10 Hz to 1 MHz offset frequencies by 20-40 dB.

Figure 3:
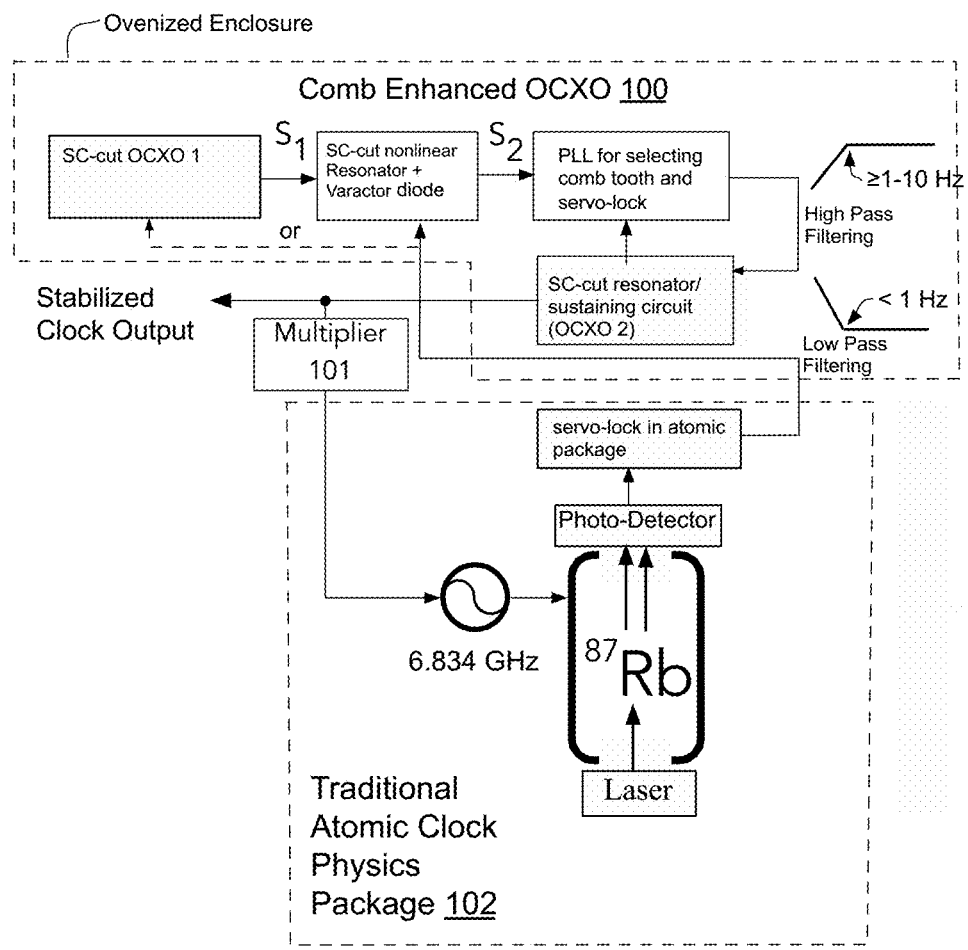
FIG. 3 is a schematic diagram of a second embodiment of a phononic comb-enhanced atomic clock in which the atomic package is used to discipline the nonlinear resonator modal frequencies (or the drive OCXO) for long-term drifts at the output.
Figure 4:
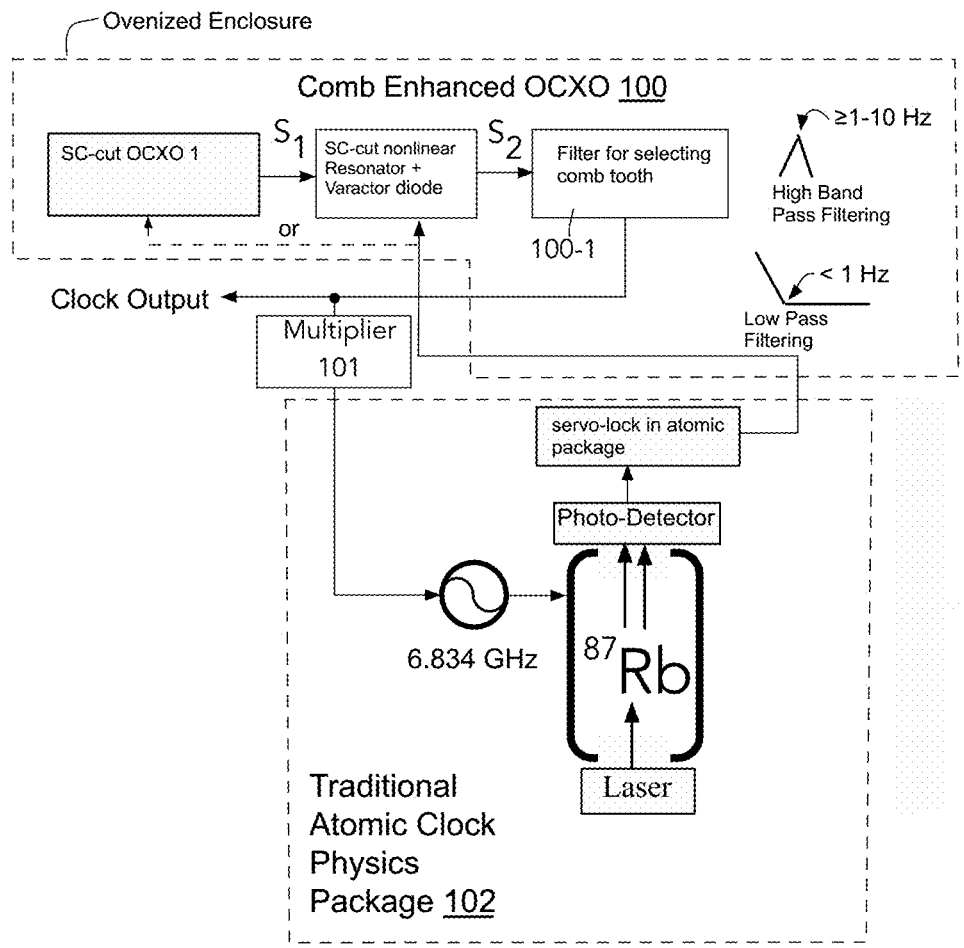
FIG. 4 is a schematic diagram of a third embodiment of a phononic comb-enhanced atomic clock in which the second OCXO 2 and the phase lock loop (PLL) is replaced with a high Q filter to filter the comb output to one primary output signal. The atomic clock is again used to servo the nonlinear resonator (or the drive OCXO) for reducing long-term drifts.

The atomic clock 102 is locked to the comb-enhanced OCXO 100 using a second servo loop output from the atomic clock with a low pass filter with a corner frequency<1 Hz. This disciplines the comb-enhanced OCXO 100 for long-term drifts (>1 sec) using the high stability of the atomic transitions. In FIGS. 1, 3 and 4 the atomic clock is depicted using an atomic transition such as electronic rubidium hyperfine transition for control. However, any other electronic atomic transition could be used such as the hyperfine transition of Cs atoms, transitions in Hg atoms, or optical transitions in Yb atoms, or clocks based on laser cooling or optical lattices to reduce Doppler line broadening and collisions.

The corner frequencies shown on FIG. 1 mentioned above (and on FIGS. 3 and 4) correspond to the −3 dB points where a single pole filter cuts off half of the power at the stated frequency. The filters may be sharper filter than the filtration that a single pole filter would provide. Ideally the roll off or "sharpness" of the filter would be infinite, but a simple two or three pole filter is a better choice than a single pole filter and should be suitable for this application and preferred compared to a single pole filter.

An embodiment of the OCXO 100 of FIG. 1 is now described in greater detail with reference to FIG. 1b with supporting data of the frequency comb shown in FIG. 1a.

Figure 1A:
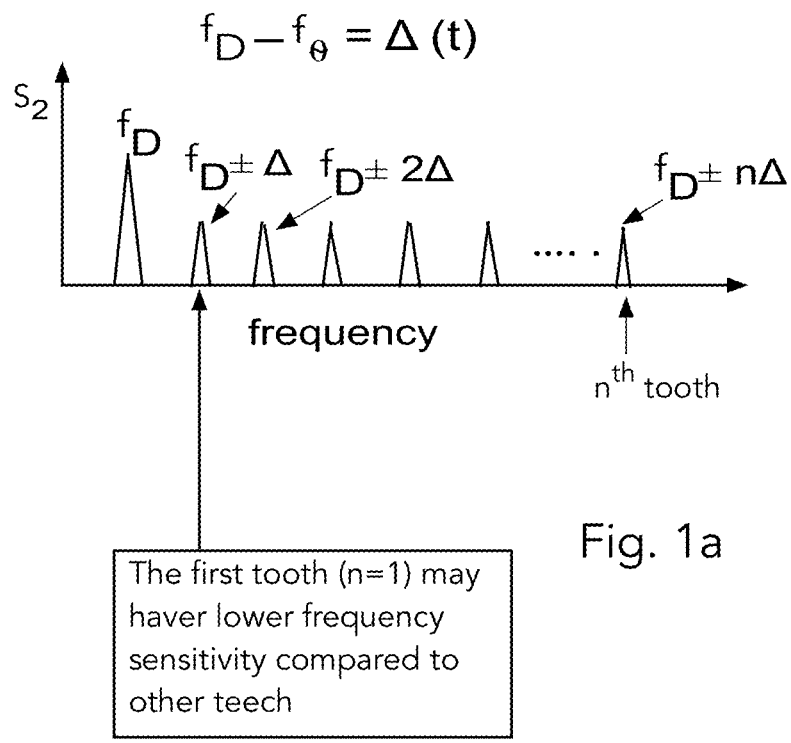
FIG. 1*a* depicts a frequency comb of n teeth generated by the non-linear resonators of FIGS. 1, 1*b*, 2 and 3.
Figure 1B:
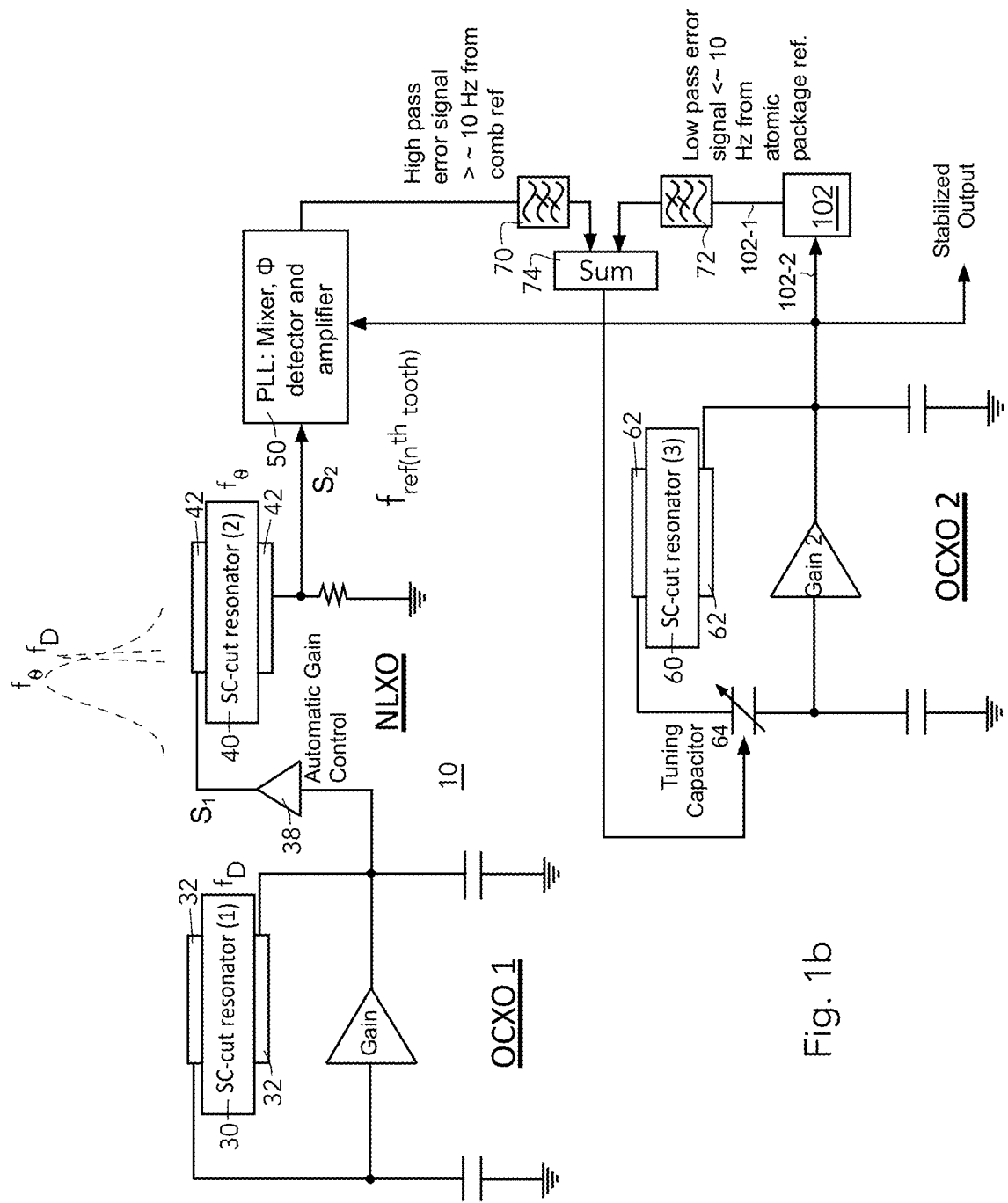
FIG. 1*b* is a schematic diagram of the circuitry with the three resonators of first embodiment of FIG. 1, showing that circuitry in greater detail.

FIG. 1b shows the basic components of one embodiment of the OCXO 100 of FIG. 1: a first OCXO(OCXO 1) comprising a resonator 30, a second OCXO (OCXO 2) acting as the sensor or oscillator and electronics comprising a mixer, a phase detector, and a PPL circuit 50 and resonator 60. The first OXCO (OXCO 1) includes the first resonator 30 that generates drive signal $S_1$ that is preferably amplified and stabilized with an automatic gain control circuit 38 and which drives the non-linear resonator 40 in the NLXO circuit. The resonator 30 has two metallic electrodes 32 disposed on opposing sides of a bar of quart material forming the resonator 30 and connecting it with the OXCO 1 sustaining circuit. The output $S_1$ of resonator 30 at a frequency $f_D$ is applied to resonator 40 which has a non-linear resonant mode at a frequency $f_\theta$. With appropriate modal coupling within resonator 40 and at drive levels below the nonlinear Duffing bifurcation condition (for which $f_\theta$ is strongly dependent on the amplitude of $S_1$), a frequency comb, $S_2$, is generated by resonator 40 as shown in FIG. 1a. The nonlinear response in the preferably quartz material of the resonator is evidenced by the generation of a frequency comb at $f_\theta$, $f_\theta \pm \Delta$, $f_\theta \pm 2\Delta$, $f_\theta \pm 3\Delta$ . . . $f\theta \pm n\Delta$, where $\Delta$ is the offset frequency which is equal to $f_D - f_\theta$. When so driven, resonator 40 may be characterized as a non-linear resonator element in a non-linear resonator oscillator (NLXO) circuit.

The resonator 40 in the NLXO circuit has two metallic electrodes 42 disposed one a bar of quartz material forming resonator 40, one of which is connected with an output of the automatic gain control circuit 38 and the other of which provide the output $S_2$ (the comb of frequencies) to circuit 50.

Circuit 50 is used to select a desired one of the teeth (frequencies) from the comb mentioned above which is then applied to high pass filter 70.

Figure 2:
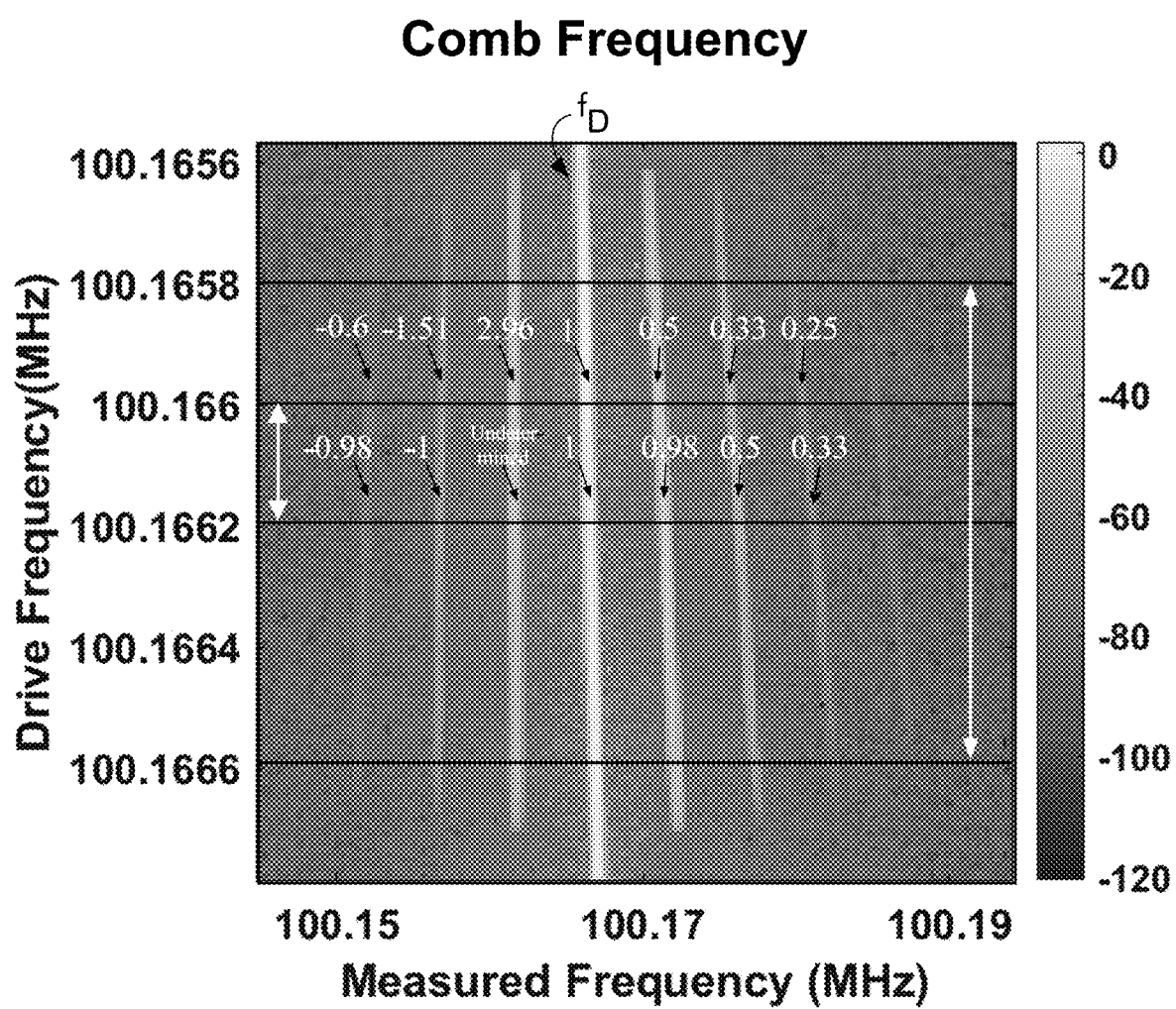
FIG. 2 depicts the comb output frequencies versus the drive frequency for a 100 MHz resonator utilizing the circuitry of FIG. 1. The slopes (the first derivative) of the drive frequency versus the frequency of a tooth of the comb are marked on this figure over two regions of drive frequency.

It has been observed, as shown in FIG. 2, that for particular teeth of the comb (see the left hand side of the comb of FIG. 2) and for a range of drive frequencies, the output frequencies of a tooth can be independent (or substantially independent) of the drive frequency as evidenced by infinite slopes (or substantially infinite slopes) of the plots of the drive frequencies versus the comb output frequencies. An infinite slope is characterized by a vertical representation on of a tooth frequency on FIG. 3. While an infinite slope might be ideal in order for the output frequencies of the teeth to be independent (or substantially independent) of the drive frequency, a slope greater than 1 is an improvement in terms of making the output frequency of a selected tooth less dependent on the drive frequency $f_D$ than just using the drive frequency $f_D$ of resonator 30 as a clock. So the selected tooth preferably has a slope whose absolute value is greater than 1. And more preferably, the selected tooth has highest slope in the waterfall plot of frequency of the tooth versus changes in the frequency of the drive signal $f_D$ depicted by FIG. 2.

In most oscillators, the far-out phase noise is determined by the electronic noise in the sustaining circuit. This noise will not be present on the modes of resonator not used within a sustaining; thus, by locking a second OCXO (OCXO 2) to a selected one (an $n^{th}$ tooth) of these teeth within a PLL and using the error signal of the PLL to correct for relative changes in frequency between OCXO (OCXO2) and $S_2$, the output frequency of second OCXO (OCXO2) can be stabilized to a level provided by the selected $n^{th}$ tooth of the comb. Using a feedback tuning signal to the varactor in OCXO (1), one can tune the frequency of the drive signal $S_1$ to the highest slope and lowest noise condition. For ease of illustration, only the higher frequency teeth are specifically shown in FIG. 1a while teeth on either side of the drive frequency are identified on FIG. 2, it being understood that the comb typically appears on both sides of the drive frequency $f_D$, for example, at frequencies shown on FIG. 2.

For the frequency drive frequency vs comb frequency response of resonator 40 shown by FIG. 2, the output frequency of second VCXO (VCXO2) might well be stabilized to a level provided by the first tooth to the left of the frequency of the drive oscillator ($f_D$) at a frequency in the range of 100.1658-100.1666 MHz because the slope (its first derivative) of the drive frequency vs. the comb frequency of this tooth in that range is 2.96. The slope is even steeper (closer to infinite) when the drive oscillator ($f_D$) is in a frequency in the range of 100.1660-100.1662 MHz Ideally, the slope (its first derivative) of the drive frequency vs. the comb frequency should be as large as possible (and the slope is infinite when the comb frequency response depicted by FIG. 2 is exactly vertical). The "Undetermined" region is due to the fact that the slope was too large to make a slope calculation with the equipment used for these measurements.

The slope of the drive frequency $f_D$ is not surprisingly equal to +1. It is angled slightly to the left in FIG. 2. As the slopes of the teeth get closer to absolutely vertical (moving in a clock-wise direction on FIG. 2 from $f_D$) they approach an infinite slope (where the tooth frequency is desirously independent of the drive frequency). As the slope of the teeth move past vertical (again rotating in a clock-wise direction), the slope values become negative. So long as the slope of a selected tooth has an absolute value greater than one, it has a desirable lower dependency on the drive frequency $f_D$. If the slope of a selected tooth increases still further, that results in a further improvement in terms of being insensitive to noise associated with the drive frequency $f_D$.

The output 102-1 of the servo lock built into the atomic clock 102 is applied to low pass filter 72, the outputs of the two filters 70, 72 are applied in the implementation of FIG. 1a via a summing junction or amplifier 74 to a tuning capacitor 64 in the OXCO 2 sustaining circuit to adjust the frequency at which resonator 60 resonates. That signal from resonator 60 forms the Stabilized Output frequency of the improved atomic clock 120 modified by the comb enhanced OXCO circuit 100. The resonator 60 has two metallic electrodes 62 disposed on a bar of quartz material forming resonator 60, one of which is connected with the tuning capacitor 64 and the other of which provides the Stabilized Output.

The reader will note that the scales of the Drive Frequency is very narrow compared to the scale of the Measured Comb Frequency of FIG. 2, so a slope of 1 (of $f_D$) is close to, but not quite, vertical in this graph. On either side of an infinite slope in FIG. 2, the slopes of the teeth can have either positive or negative values. Since ideally the absolute value of the first derivative of the drive frequency versus the frequency of a tooth in the comb should have value greater than 1 (and more preferably much greater than 1 and, even more preferably, infinite), operating the clock of FIG. 1 utilizing a NLXO generating a tooth having a slope of either 2.96 or a slope marked "Undetermined" (for the depicted drive frequencies $f_D$) would be the best option for a NLXO producing a comb as shown in FIG. 2. A reduction in the sensitivity of particular comb teeth to the drive frequency $f_D$ variations is attained if the first derivative of the drive frequency versus the frequency of a selected tooth of the comb has an absolute value greater than 1. The selected tooth should also have sufficient amplitude (see also FIG. 2a) to be easily selected by the circuitry provided for tooth selection.

In FIG. 2 the slopes listed in the upper row for the various teeth were measured of a range corresponding to the longer double-headed arrow, while the slopes listed in the lower row for the various teeth were measured of a range corresponding to the shorter doubled-headed arrow.

Figure 2A:
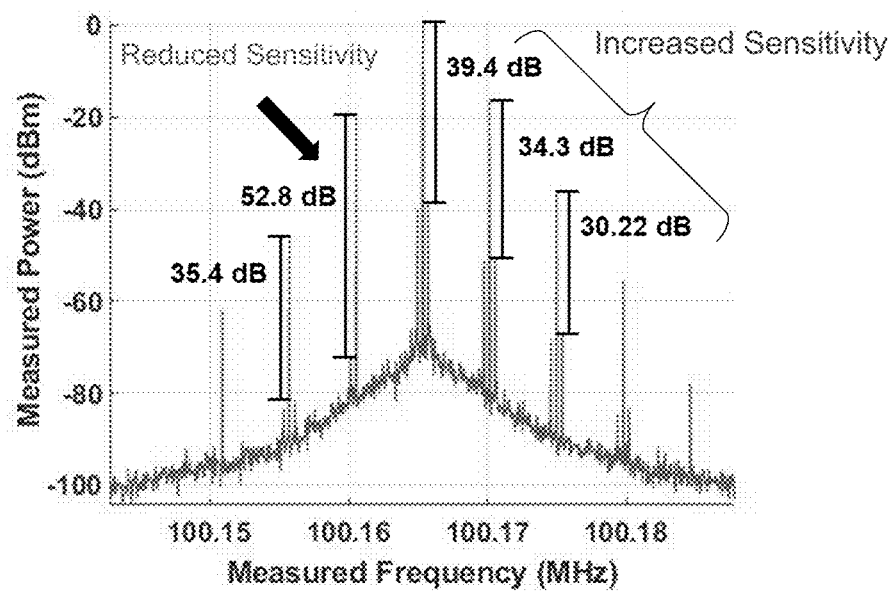
FIG. 2*a* depicts the comb in FIG. 1*a* but with a 400 Hz FM modulation of the drive frequency applied. The sidebands around each tooth represent the transfer of this modulation on each tooth. The tooth to the left of the drive frequency shows a suppression of the relative amplitude of the modulation to the peak amplitude of that tooth.

This reduction in the sensitivity of particular comb teeth to the drive frequency variations is also shown in FIG. 2a where a 400 Hz FM modulation is added to the drive frequency. The increase in the signal-to-noise (S/N) ratio for the first tooth to the left of the drive frequency shows that this comb tooth can reduce noise on the drive signal.

The inventors of the presently disclosed technology have observed that the high frequency jitter of first VCXO (VCXO1) can be substantially reduced using this technique. Since a large portion of the phase noise of an oscillator is due to noise within the sustaining circuit (VCXO1 the embodiment of FIG. 1), this noise will not be present in resonator 40. Thus, the infinite slope region (left side of the comb in FIG. 3) of a comb will tend to filter out the electronic noise.

The above design can be implemented in a quartz MEMS process in which VCXO (1), resonator (1), resonator (2), and VCXO (2) are all integrated with the PLL on a common semiconductor ($S_1$, for example) substrate using quartz piezoelectric resonators. This will provide a chip-scale oscillator with dimensions of roughly≤20 mm$^3$ (a single quartz MEMS TCXO has been demonstrated with dimensions of 2×3 mm², see R. L. Kubena, et al., "A Fully Integrated Quartz MEMS VHF TCXO," 2017 IEEE Frequency Control Symposium, Besancon, Fr., pp. 68-71, July 2017, which is hereby incorporated by reference). In addition, the components can be ovenized for additional stability over temperature leading to a comb-enhanced OCXO. Finally, although quartz resonators have demonstrated high-Q combs with these unique features, other MEMS resonators formed of materials such as $S_1$ or AlN could be utilized instead so as long as they demonstrate the desired nonlinear and modal coupling effects.

Additional embodiments are shown in FIGS. 3 and 4. In the embodiment shown in FIG. 3, the atomic clock is used to discipline the non-linear element of the NLXO to afford on overall long-term stability of the output. By applying a voltage to a varactor diode in series or parallel with the non-linear resonator (similar to that used for temperature compensating a TCXO), the resonator's resonances can be shifted relative to the drive signal to stabilize (lock) the comb teeth frequencies to the atomic transitions to stabilize short term stability of the output.

In FIG. 4 the atomic package feedback is also applied to the nonlinear resonator as in FIG. 3, but the second OCXO 2 and the PLL lock is replaced with a high-Q filter 100-1 (also identified as element 51 of FIGS. 41 and 4b) to filter out all the teeth frequencies from the comb except for the selected tooth which preferably has the lowest phase noise (high S/N ratio and low sensitivity to input frequency fluctuations as described above with reference to FIGS. 2 and 2a). In this embodiment, the output is not produced by OCXO 2, which is disciplined by the comb, but rather by the comb itself. This simplifies the circuit and eliminates noise generated by the PLL, but does not does not produce as clean a signal at the output as second embodiment (see FIG. 3) based on the attenuation of the filter and does not allow tailoring the bandwidth of the feedback loop around the comb for more optimal performance.

Figure 3A:
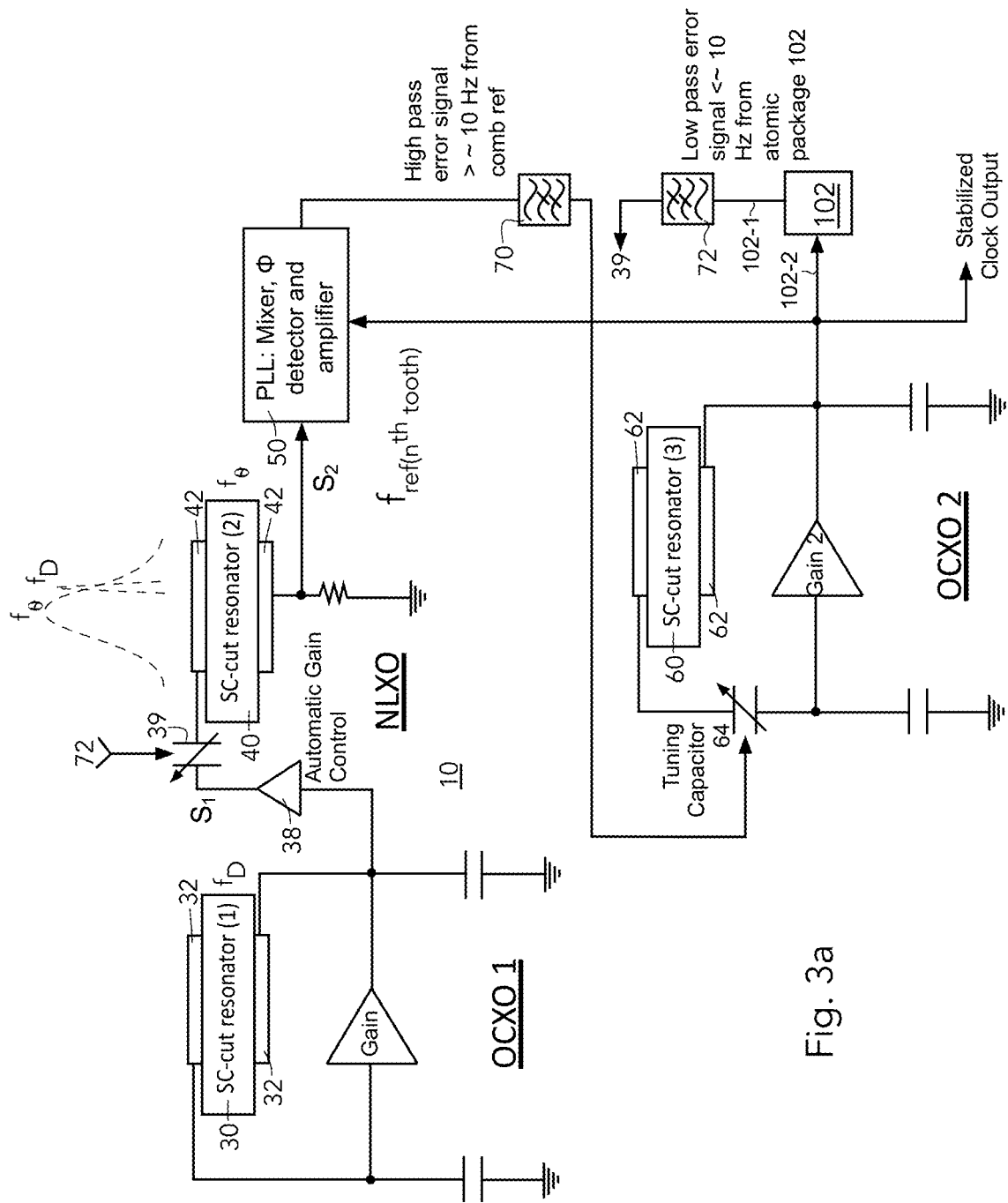
Figure 3B:
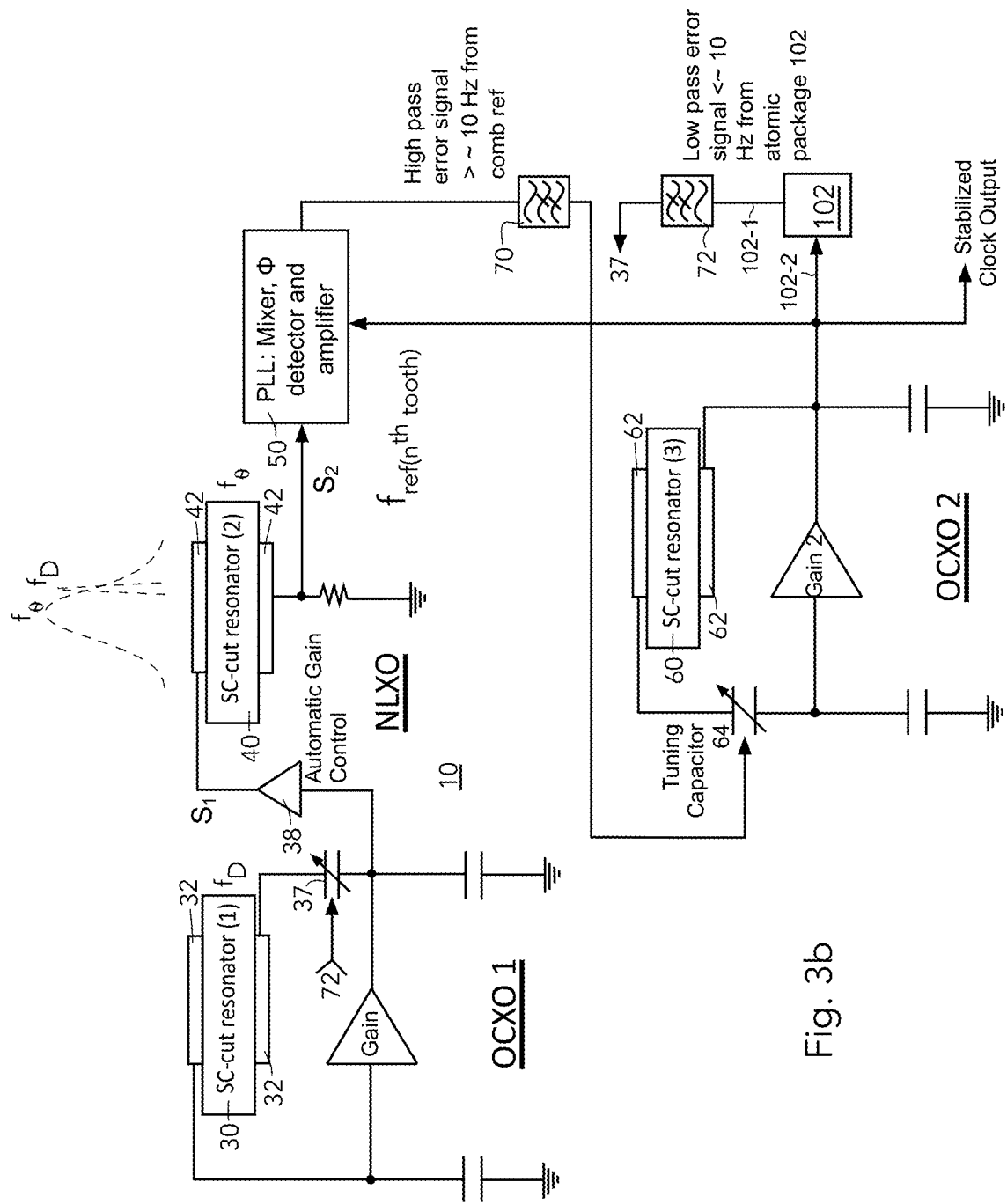
FIG. 3*b* depicts a slightly different implementation of the embodiment of FIG. 3.
Figure 4A:
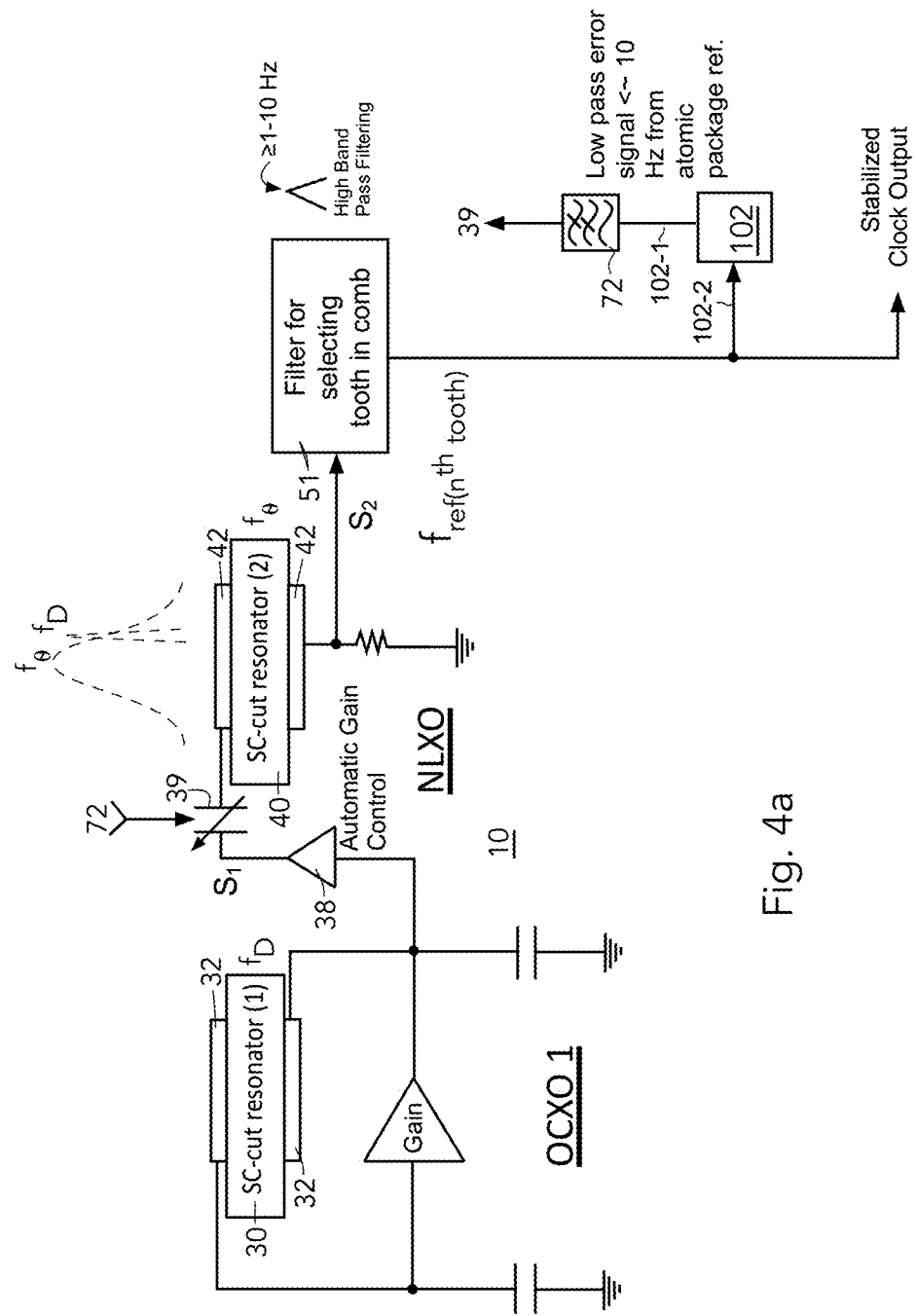
Figure 4B:
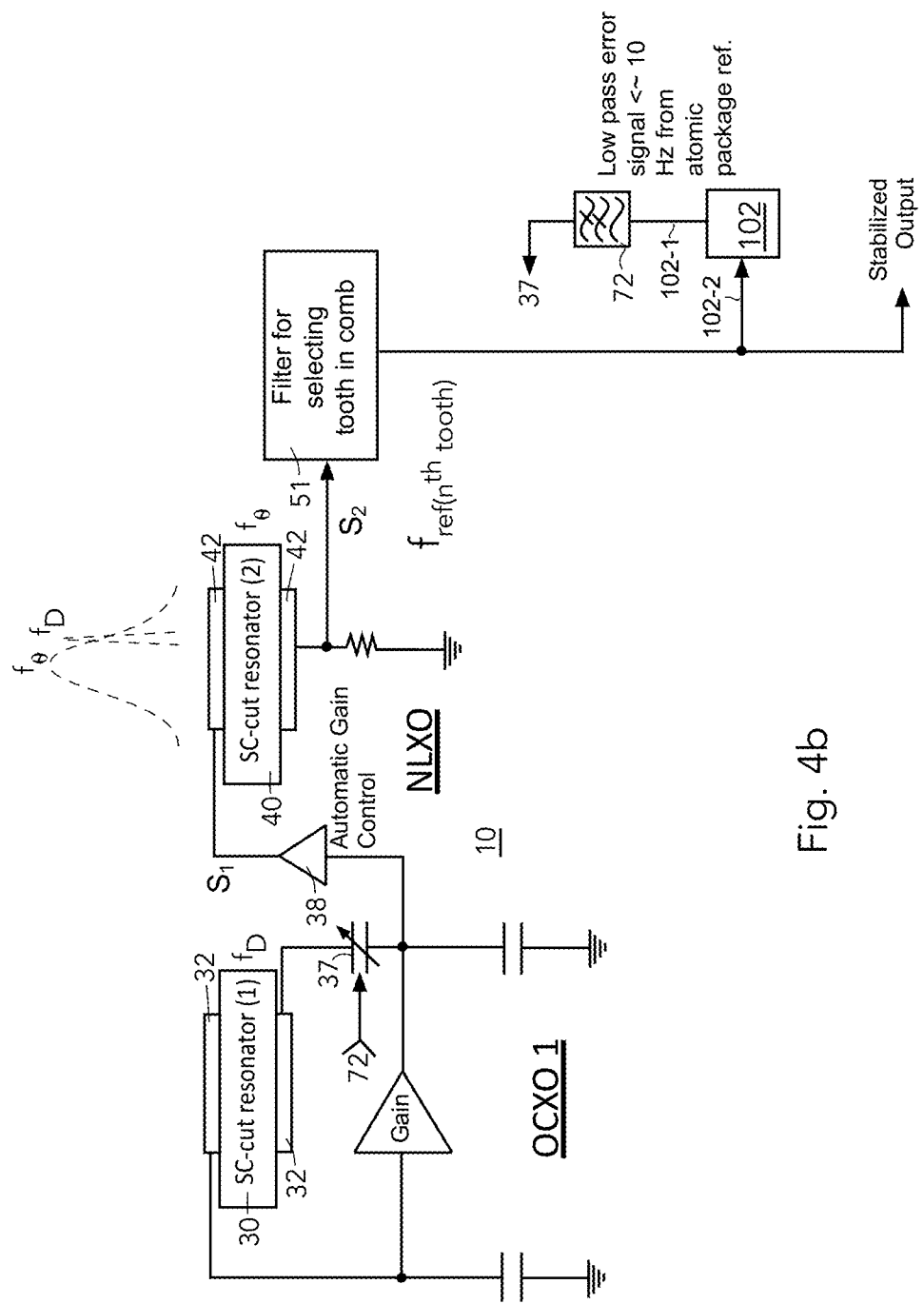
FIG. 4b depicts a slightly different implementation of the embodiment of FIG. 4.

FIGS. 3a and 3b depict possible implementations the embodiment of FIG. 3 while FIGS. 4a and 4b depict possible implementations the embodiment of FIG. 4. The reader will note that in the implementation of FIG. 1b, the usual output 102-1 of the atomic clock 102 is applied to low pass filter 72 while the output of circuit 50 (used to select a desired one of the teeth) is applied to high pass filter 70,. The outputs of the two filters 70, 72 are applied, in the implementation of FIG. 1b, via a summing junction or amplifier 74 to a tuning capacitor (a varactor diode, for example) 64 in the OXCO 2 sustaining circuit to adjust the frequency at which resonator 60 resonates. In the implementations of FIGS. 3a and 3b, the output of the filters 70 and 72 are handled somewhat differently . . . the output of filter 70 is applied to the tuning capacitor 64 of the OXCO 2 sustaining circuit (without an intervening summing junction) while the output of filter 72 is applied to a different tuning capacitor, namely either a tuning capacitor 39 arranged between the OCXO 1 and NLXO circuits (see FIG. 3a) or a tuning capacitor 37 in the OCXO 1 circuit (see FIG. 3b).

In the embodiment of FIG. 4 the second OCXO 2 and the PLL lock is replaced with the high-Q filter 100-1 so the filter 70 is no longer utilized. As in the implementations of FIGS. 3a and 3b, the output of filter 72 is applied to a tuning capacitor, either a tuning capacitor 39 arranged between the OCXO 1 and NLXO circuits (see FIG. 4a) or a tuning capacitor 37 in the OCXO 1 circuit (see FIG. 4b).

Other permutations to these ideas will now be apparent to those skilled in the art, such as using the atomic transitions to servo back to OCXO 1 to shift the drive frequency of the comb relative to the nonlinear resonator's modal frequencies for reducing the long-term drift of the output frequency.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein. For example, it should now be apparent that the disclosed technology may be used to stabilize other reference oscillators than those associated with atomic clocks.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of. . . . ".

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. An atomic clock having a reference oscillator in which stability of the reference oscillator is improved by a stability of a selected tooth of a phononic comb of frequencies; said selected tooth of the phononic comb being a tooth of the phononic comb having a best stability among the teeth of the phononic comb; wherein a nonlinear element is driven by a first crystal controlled oscillator for generating said phononic comb of frequencies comprising a plurality of teeth and wherein said selected tooth of the phononic comb is a selected one of said teeth.

2. The atomic clock of claim 1 in which said selected tooth of the phononic comb is locked to a second crystal controlled oscillator for producing a timing reference signal for application as a reference for exciting atomic transitions in said atomic clock.

3. The atomic clock of claim 2 in which the tooth of the phononic comb which is locked to said second crystal controlled oscillator utilizes a phase locked loop (PLL) for servoing out noise greater than 1 Hz offset from the timing reference signal of the second crystal oscillator.

4. The atomic clock of claim 2 in which the first crystal-controlled oscillator, the nonlinear element, and the second crystal-controlled oscillator are embodied by SC-cut quartz resonators which are preferably ovenized in a common housing or package.

5. The atomic clock of claim 3 in which the atomic clock includes means to servo out long-term drifts c-j second using the stability of the atomic transitions of the atomic clock.

6. The atomic clock of claim 5 in which the means to servo out long-term drifts>1 second generates an error control signal which is applied through a low pass filter to the second crystal-controlled oscillator.

7. The atomic clock of claim 6 in which the error control signal is applied to the nonlinear resonator producing the phononic comb to shift frequencies of the plurality of teeth relative to a drive frequency generated by the first crystal-controlled oscillator.

8. The atomic clock of claim 7 in which a varactor diode is connected with the first crystal-controlled oscillator to shift the frequencies of the teeth generated by the nonlinear element.

9. The atomic clock of claim 6 in which the error control signal is applied to the first crystal controlled oscillator producing the drive signal to the nonlinear element for shifting the drive frequency relative to the frequencies of the teeth of the nonlinear element.

10. The atomic clock of claim 1 in which the phononic comb of frequencies is filtered to define a dominant frequency tone, said dominant frequency tone corresponding to the selected tooth of the phononic comb of frequencies.

11. The atomic clock of claim 10 in which an error control signal is applied to the nonlinear element producing the phononic comb of frequencies to shift the frequencies of teeth generated the nonlinear element relative to the drive frequency.

12. The atomic clock of claim 10 in which the error control signal is applied to the first crystal-controlled oscillator producing the drive signal to the nonlinear resonator for shifting the drive frequency relative to the frequencies of the nonlinear element.

13. The atomic clock of claim 1 in which both the first crystal-controlled oscillator and the nonlinear element are embodied by SC-cut resonators which are preferably ovenized in a common housing or package.

14. The atomic clock of claim 1, wherein the greater a tooth stability is, the greater is the slope of a plotting of the tooth's frequency on an x-axis versus changes in the frequency of a drive signal utilized to generate the phononic comb plotted on a y-axis.

15. A method of stabilizing an atomic clock reference oscillator, the method comprising selecting a particular tooth from a phononic comb of frequency teeth generated by a non-linear element and applying a correction signal to said atomic clock reference oscillator, the correction signal being based the selected particular tooth of said phononic comb; said selected particular tooth of the phononic comb being a tooth of the phononic comb having a best stability among the teeth of the phononic comb.

16. The method of claim 15 wherein the teeth stability is evidenced by the fact that the teeth, when their frequencies are plotted on an x-axis versus changes in the frequency of a drive signal utilized to generate the phononic comb are plotted on a y-axis, the selected tooth has a slope on the plot that is greater than all or at least most of the other teeth that are also plotted.

17. The method of claim 16 wherein the selected tooth of the phononic comb has a slope on the plot of phononic comb of frequency teeth versus changes in the frequency of a drive signal utilized to generate the phononic comb, which slope has an absolute value greater than one.

18. The method of claim 15 wherein the non-linear element comprises a crystal resonator which is driven into a non-linear mode of vibration by a driving circuit which includes a resonator-controlled oscillator.

19. The method of claim 15 wherein the reference oscillator is embedded in or associated with an atomic clock.

20. A clock having a reference oscillator in which stability of the reference oscillator is improved by a stability of a selected tooth of a comb of frequencies; said selected tooth of the phononic comb being a tooth of the phononic comb having a best stability among the teeth of the phononic comb;
wherein a nonlinear element is driven by a first crystal controlled oscillator for generating said comb of frequencies, the comb of frequencies comprising a plurality of frequency teeth and wherein said selected tooth of the comb is a selected one of said frequency teeth.

21. The clock of claim 20, wherein the greater a tooth stability is, the greater is the slope of a plotting of the tooth's frequency on an x-axis versus changes in the frequency of a drive signal utilized to generate the phononic comb plotted on a y-axis.

22. The clock of claim 20 in which said selected tooth of the comb of frequencies is locked to a second crystal controlled oscillator for producing a timing reference signal for generation as a reference for the clock.

23. The clock of claim 22 in which the tooth of the comb of frequencies is locked to said second crystal controlled oscillator utilizes a phase locked loop (PLL) for reducing noise greater than 1 Hz offset from the timing reference signal of the second crystal oscillator.

24. The clock of claim 23 in which the clock includes means to reduce long-term drifts>1 second.

25. The clock of claim 24 in which the means to reduce long-term drifts>1 second generates an error control signal which is applied through a low pass filter to the second crystal-controlled oscillator.

26. The atomic clock of claim 25 in which the error control signal is applied to the nonlinear resonator producing the comb of frequencies to shift the frequencies of the plurality of teeth relative to a drive frequency generated by the first crystal-controlled oscillator.

27. The clock of claim 26 in which a varactor diode is connected with the first crystal-controlled oscillator to shift the frequencies of the teeth of the nonlinear element.

28. The clock of claim 27 in which the error control signal is applied to the first crystal controlled oscillator producing the drive signal to the nonlinear element for shifting the drive frequency relative to the frequencies of the teeth generated by the nonlinear element.

29. The clock of claim 20 in which the comb of frequencies is filtered to define a dominant frequency tone, said dominant frequency tone corresponding to the selected tooth of the comb of frequencies.

30. The clock of claim 29 wherein an error control signal is applied to the nonlinear element producing the comb of frequencies to shift the frequencies of teeth generated the nonlinear element relative to the drive frequency.

31. The clock of claim 29 wherein the error control signal is applied to the first crystal-controlled oscillator producing the drive signal to the nonlinear resonator for shifting the drive frequency relative to the frequencies of the nonlinear element.

\* \* \* \* \*